(12) United States Patent
Reshotko et al.

(10) Patent No.: US 7,084,471 B2
(45) Date of Patent: *Aug. 1, 2006

(54) PHOTOSENSITIVE DEVICE

(75) Inventors: Miriam R. Reshotko, Portland, OR (US); Shaofeng Yu, Lake Oswego, PR (US); Bruce A. Block, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/122,685

(22) Filed: May 4, 2005

(65) Prior Publication Data

US 2005/0202312 A1 Sep. 15, 2005

Related U.S. Application Data

(63) Continuation of application No. 10/366,861, filed on Feb. 13, 2003, now Pat. No. 6,903,432.

(51) Int. Cl.
*H01L 29/72* (2006.01)
(52) U.S. Cl. ...................................... 257/428; 257/457
(58) Field of Classification Search ................. 257/428
See application file for complete search history.

(56) References Cited

U.S. PATENT DOCUMENTS 4,320,418 A 3/1982 Pavliscak

| 4,998,154 A | 3/1991 | Surridge et al. |
| 5,525,828 A * | 6/1996 | Bassous et al. ............. 257/457 |
| 5,623,361 A | 4/1997 | Engle |
| 5,631,490 A | 5/1997 | Dutta et al. |

OTHER PUBLICATIONS

M. Loken et al., "Fabrication of ultrafast Si based MSM photodetector," Electronics Letters, May 14, 1998, vol. 34, No. 10 (© IEEE 1998, No. 19980661).
M.Y. Liu et al., "140-GHz metal-semiconductor-metal photodetectors on silicon-on-insulator substrate with a scaled active layer," Appl. Phys. Lett. 65 (7) Aug. 15, 1994 (© American Institute of Physics).
Lorenzo Colace et al., Ge-on-Si Approaches to the Detection of Near-Infrared Light, IEEE Journal Of Quantum Electronics, vol. 35, No. 12, Dec. 1999 (© 1999 IEEE).
Li-Hong Laih et al., "Characteristics of MSM Photodectors with Trench Electrodes on P-Type Si Wafer", IEEE 1998.
Cha-Shin Lin et al., "Reducing Dark Current in a High-Speed Si-Based Interdigitated Trench-Electrode MSM Photodector", IEEE 2003.

* cited by examiner

*Primary Examiner*—Edward Wojciechowicz
(74) *Attorney, Agent, or Firm*—Fish & Richardson P.C.

(57) ABSTRACT

A photosensitive device for enabling high speed detection of electromagnetic radiation. The device includes recessed electrodes for providing a generally homogeneous electric field in an active region. Carriers generated in the active region are detected using the recessed electrodes.

26 Claims, 5 Drawing Sheets

PHOTOSENSITIVE DEVICE

CROSS-REFERENCE TO RELATED APPLICATIONS

This application is a continuation of U.S. patent application Ser. No. 10/366,861, filed Feb. 13, 2003, now U.S. Pat. No. 6,903,432. The disclosure of the prior application is considered part of (and is incorporated by reference in) the disclosure of this application.

BACKGROUND

Photodetectors, such as metal-semiconductor-metal (MSM) photodetectors, may be used to detect electromagnetic (EM) radiation. Photodetectors provide a mechanism for producing an electronic signal based on incident light.

FIG. 1A shows a cross section of an MSM photodetector 100. Photodetector 100 includes an active layer 120 formed on a substrate 110, as well as conductive electrodes 130A and 130B formed on the top surface of active layer 120.

A potential difference applied between electrodes 130A and 130B produces an electric field in active layer 120. The electric field exerts a force on carriers generated in active layer 120 toward electrodes 130A or 130B. For instance, holes may move toward one electrode and electrons toward the other electrode. The carriers are subsequently detected as photocurrent. FIG. 1B illustrates the electric field produced by applying a bias voltage to conductive electrodes 103A and 130B.

Variations on this photodetector design include photodetectors using a thin semiconductor layer such as a silicon-on-insulator (SOI) layer. Using this design, carriers generated below the insulator layer are not collected by the electrodes, so that the detected carriers are those generated within a relatively small and uniform distance from the electrodes, in a region with a relatively strong electric field.

Alternately, a vertical structure is used rather than the planar structure shown in FIGS. 1A and 1B. For example, one electrode is formed from a buried metallic layer, while a top metallization layer forms the second electrode.

DETAILED DESCRIPTION

The current application provides generally planar photosensitive devices with recessed electrodes. An active layer for generating carriers in response to incident light is disposed between the electrodes. The carriers may be detected by applying a potential difference between the electrodes. The devices provide a number of advantages compared with available photodetectors.

Figure 1A:
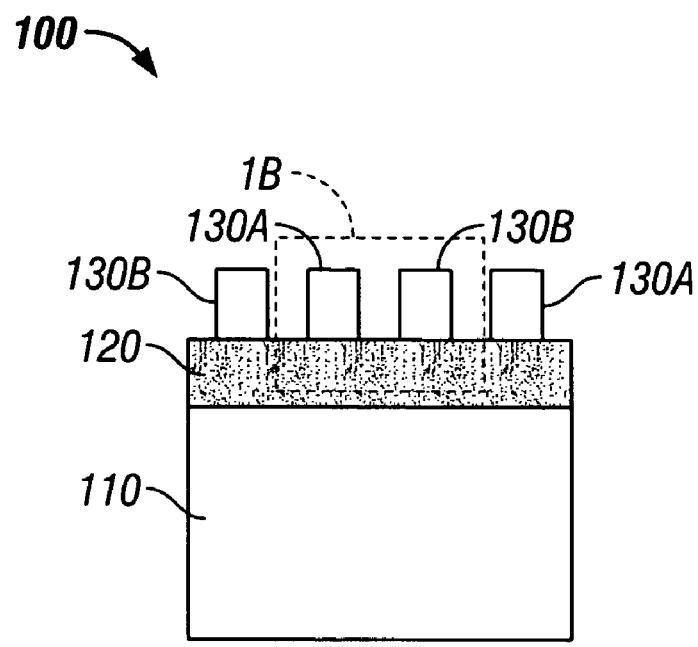
FIG. 1A is a cross-sectional view of a MSM photodetector.
Figure 1B:
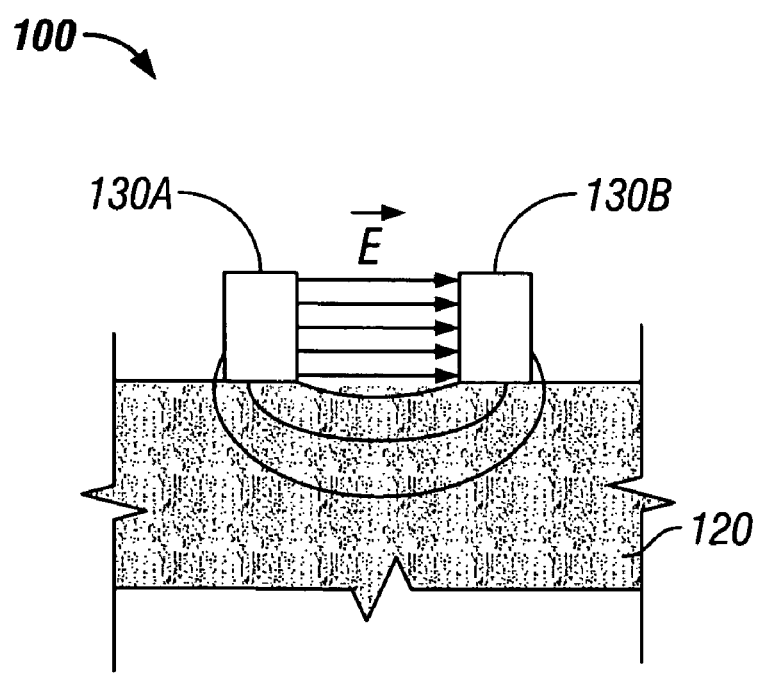
FIG. 1B is a cross-sectional view of a MSM photodetector, illustrating electric field lines resulting from biased electrodes.

The inventors have found that available photodetectors, such as those illustrated in FIGS. 1A and 1B, may not provide optimum sensitivity and speed. FIG. 1B shows a close up of the field in the region near two segments of electrodes 130A and 130B, excluding effects from neighboring electrode segments (e.g., an electric field would be produced to the left of the illustrated segment of electrode 130A, toward an unillustrated segment of electrode 130B). As FIG. 1B illustrates, the electric field is generally uniform and of maximum strength between electrodes 130A and 130B; i.e., above active layer 120. Inside active layer 120, i.e. in the region where the electron/hole pairs are produced in response to absorbed photons, the electric field is not only weaker than the field between electrodes 130A and 130B, but is also non-uniform. Further, carriers produced deeper in active layer 120 must travel longer distances under the influence of weaker electric fields to reach electrodes 130A and 130B.

Since carriers produced deeper in active layer 120 travel longer distances to reach electrodes 130A and 130B, and since the field is non-uniform and weaker deeper in active layer 120, the detected photocurrent is spread out in time. This also leads to a smaller peak signal in the detected photocurrent, which may limit the ability of MSM photodetector 100 to detect some signals.

Prior attempts to solve the problems with MSM photodetectors include using a thin semiconductor layer such as a silicon-on-insulator (SOI) layer so that those carriers that are collected as photocurrent are generated within a more uniform distance from the electrodes and in a region of higher field. However, this scheme may decrease the responsivity of the photodetector, since carriers generated below the insulator layer are not collected in the electrodes. Here, the term responsivity refers to the percentage of incident photons that generate electron-hole pairs that are collected by the electrodes.

Alternately, some available photodetectors use a vertical structure rather than the planar structure described above, so that the field is generally constant across the active layer. However, using a vertical structure leads to similar problems to those experienced with SOI devices. In order to increase the speed of the device, the active layer is relatively thin. However, a thin active layer does not absorb as many of the incident photons as a thicker layer. Therefore, using a SOI layer or a vertical structure involves tradeoffs between speed and responsivity.

In contrast, the current application provides a photodetector for providing improved signal height and width without reducing responsivity. The photodetector includes recessed electrodes to provide a more uniform electric field in the region where carriers are generated. However, since a generally planar structure is used, the thickness of the active layer can be increased and can be at least equal to the absorption depth of the electromagnetic radiation in the wavelength range of interest. In this way, responsivity is not compromised.

Figure 2A:
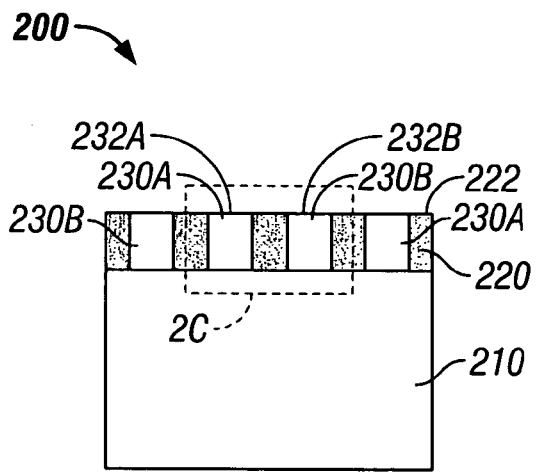
FIG. 2A is a cross-sectional view of a photodetector.

FIG. 2A shows a photosensitive device 200 formed on a substrate 210. Device 200 includes a first electrode 230A and a second electrode 230B, with an active region 220 comprising photosensitive material between first electrode 230A and second electrode 230B. A top surface 232A of first electrode 230A, a top surface 232B of second electrode 230B, and a top surface 222 of active region 220 are generally co-planar, so that first electrode 230A and second electrode 230B are recessed. A cross-section of two segments of first electrode 230A and second electrode 230B are shown, although the number of interdigitated fingers may be more or less than the number shown.

Figure 2B:
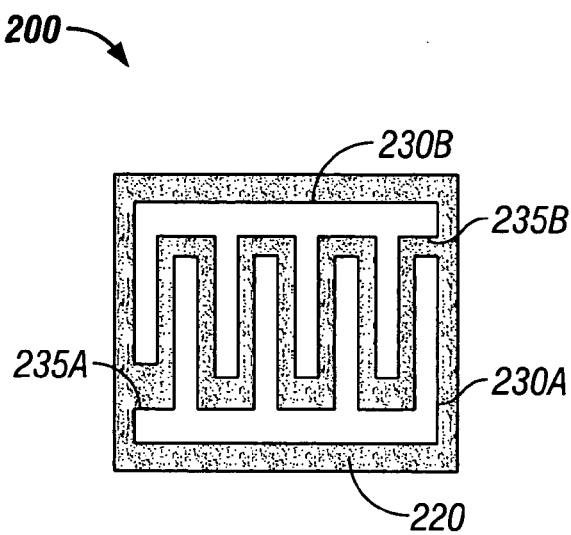
FIG. 2B is a top view of a photodetector.

Referring to FIG. 2B, first electrode 230A and second electrode 230B are interdigitated, so that the distance between first electrode 230A and second electrode 230B is relatively small, while the area of active region 220 available to receive incident light is relatively large. Active region 220 is between first electrode 230A and second electrode 230B, with first electrode 230A adjacent to a first side 235A of active region 220, and second electrode 230B adjacent to a second side 235B of active region 220.

The distances used for the overall length of the electrodes (e.g., the sum of the lengths of the segments of first electrode 230A or second electrode 230B) and for the inter-electrode gap may be varied for different implementations. Smaller inter-electrode gaps decrease the average distance that generated carriers travel before reaching an electrode, but also increase the capacitance of the device. Similarly, larger electrode lengths correspond to larger detector areas, but also increase the capacitance of the device.

Generally, inter-electrode gaps of between about 0.2 microns and about 3 microns may be used, with a gap of about 1 micron being fairly typical. The total detector area for a very high speed detector is generally less than about 200 square microns, while a more typical detector may have an area of about 400 square microns, corresponding to a finger length of about 19 microns and a gap of about 1 micron.

Figure 2C:
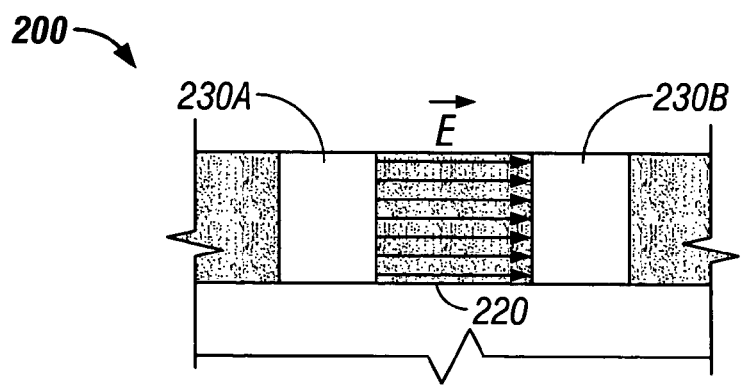
FIG. 2C is a cross-sectional view of a pair of electrodes corresponding to a photodetector such as that shown in FIGS. 2A and 2B, illustrating electric field lines resulting from biased electrodes.

Referring to FIG. 2C, a potential difference may be applied between first electrode 230A and second electrode 230B, producing a generally homogeneous electric field in active region 220. In FIG. 2C, the field generated only by the highlighted segments of electrodes 230A and 230B is shown (e.g., a generally homogeneous field would be produced in the area of active region 220 to the left of the shown segment of electrode 230A due to an unillustrated segment of electrode 230B). Carriers generated in active region 220 have a relatively short distance to travel before encountering an electrode (the maximum distance is about equal to the distance between the electrodes). Since each carrier moves in response to an electric field of about the same magnitude, the speed of each carrier is about the same as the speed of other carriers of the same type.

Additionally, a thickness of active region 220 may be about equal to the absorption length of incident radiation or greater, so that most photons will be absorbed in active region 220. Unlike the SOI and vertical structures described above, the responsivity of the device need not be compromised in order to achieve high speed and low pulse width.

A number of different materials may be used for active region 220, electrodes 230, and substrate 210. Generally, active region 220 includes a material that absorbs photons in a wavelength range of interest. Materials that may be used for active region include silicon and germanium, as well as III–V materials such as gallium arsenide and II–VI materials such as ZnSe compounds. In some cases, the materials may include one or more dopants.

Substrate 210 may be a material that does not absorb photons in the wavelength range of interest. In some implementations, an undoped silicon substrate is used.

For some implementations, substrate 210 may include one or more intervening layers between a first substrate material and device 200. For example, substrate 210 may include a silicon portion and an oxide layer provided on a top surface of the silicon portion. Active region 210 and electrodes 230A and 230B may be formed on the oxide layer, so that carriers generated in substrate 210 are not collected in the electrodes. An intervening oxide layer may also prevent leakage of generated carriers.

FIGS. 3A–3G show process steps that may be used to produce a photosensitive semiconductor device such as device 200 of FIGS. 2A–2C.

Figure 3A:
FIGS. 3A–3G show process steps for forming a photodetector.
Figure 3B:
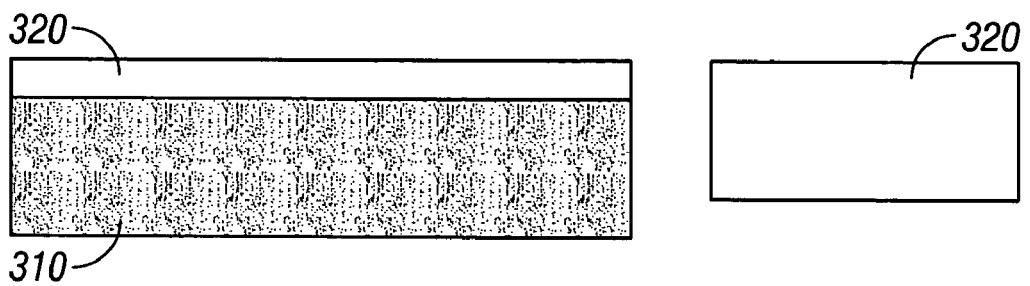

Referring to FIGS. 3A and 3B, a silicon substrate 310 is provided. A blanket layer of germanium is deposited by chemical vapor deposition (CVD) or molecular beam epitaxy (MBE), forming an active layer 320 on substrate 310.

Figure 3C:
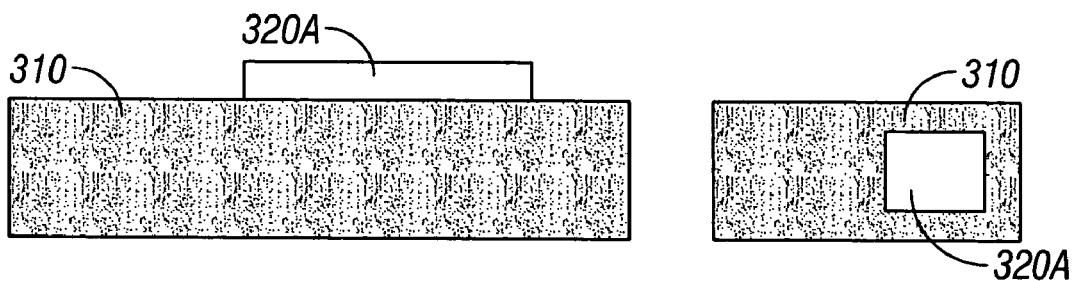

Referring to FIG. 3C, after forming active layer 320, mesas such as a mesa 320A are formed on substrate 310, defining photodetector regions. Mesas may be formed using photolithography followed an etch process. The etch process is generally selective to germanium with respect to silicon, so that germanium not included in the mesas is removed, while a relatively small amount of substrate 310 is removed.

Figure 3D:
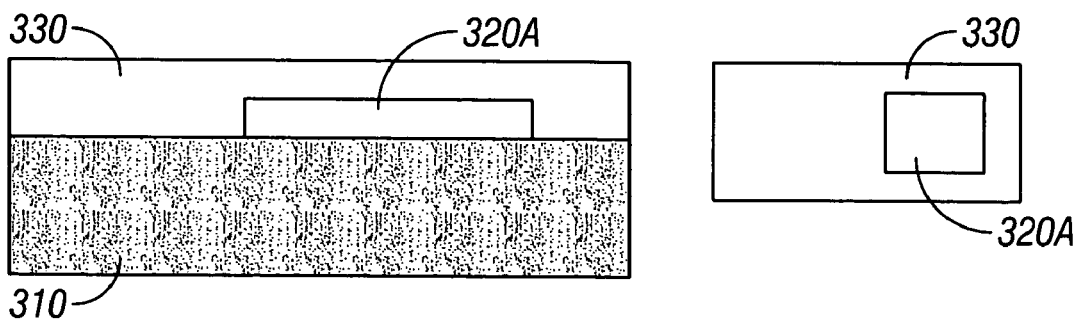
Figure 3E:
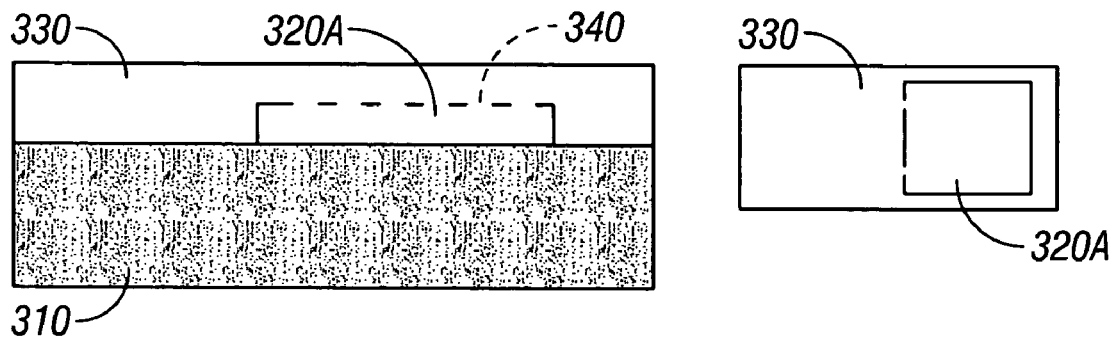
Figure 3F:
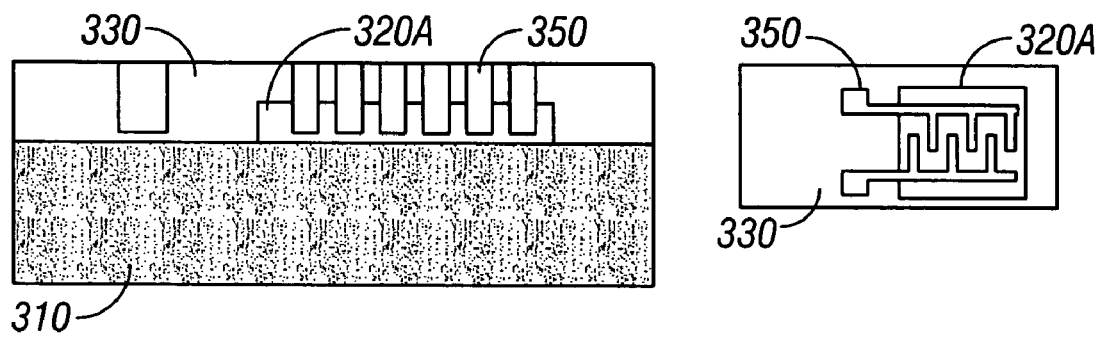

Referring to FIG. 3D–3F, a CVD oxide layer 330 is formed over the device. Electrode regions such as trenches 340 for electrodes and pads are formed using an appropriate etch process, such as a two step etch where the first step is selective to oxide (e.g., the first step etches oxide efficiently) and the second step is selective to germanium (e.g., the second step etches germanium efficiently). Trenches 340 are filled with electrode material 350.

Figure 3G:
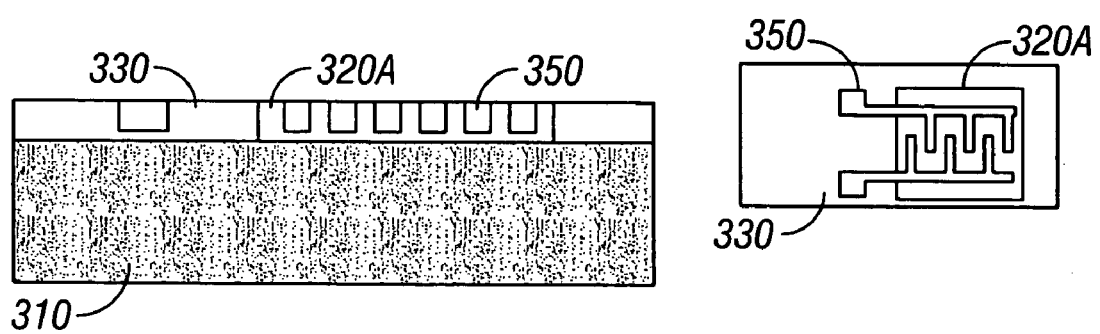

Referring to FIG. 3G, a polish such as a chemical mechanical polish (CMP) is subsequently performed to polish the structure to the surface of active layer 320. Subsequent to the polishing step, a top surface of the electrodes is generally coplanar with a top surface of active layer 320.

Other implementations are possible. As stated above, an intervening layer such as an oxide layer may be formed between substrate 310 and active layer 320. The active layer 320 formed on an intervening oxide layer may be polycrystalline rather than a single crystal material.

Figure 4:
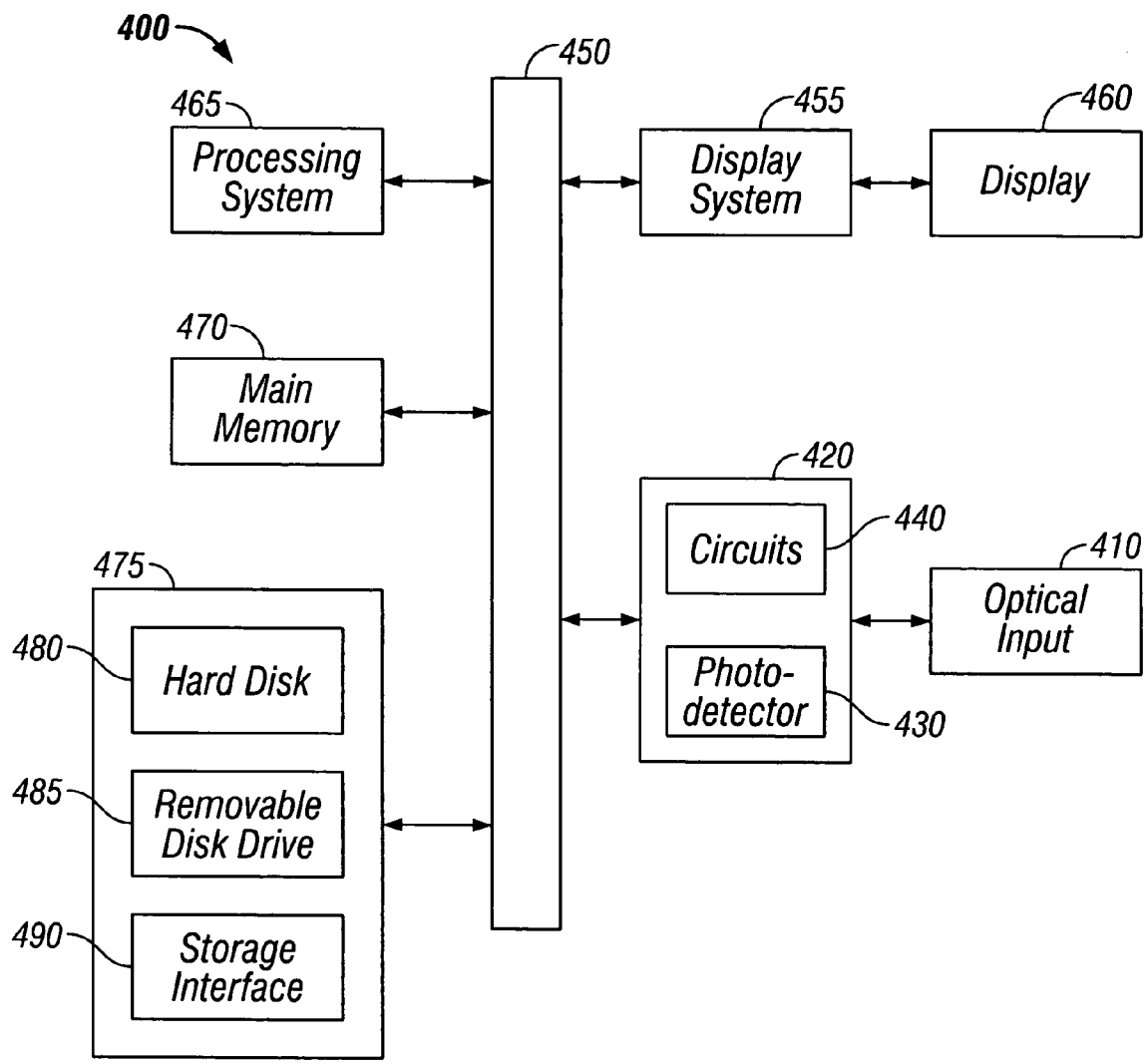
FIG. 4 shows a computer system including a photosensitive device such as that shown in FIGS. 2A–2C.

Photosensitive devices such as device 200 of FIG. 2 may be used in a variety of applications. For example, a photodetector may detect EM radiation used in optical communications applications, and convert the radiation to an electrical signal that may be processed using passive and active electrical elements. Referring to FIG. 4A, a computer system 400 includes an input 410 for receiving a fiber optic signal. Input 410 is coupled to device 420 including a photosensitive device 430. Photosensitive device 430 includes recessed electrodes such as electrodes 230 of FIG. 2, where an active layer for absorbing photons received on input 410 is included between the recessed electrodes.

The active layer may include a material that generates carriers in response to incident light of a particular wavelength range of interest. For example, optical communications systems may use light with a wavelength of about 850 nanometers, about 1.3 microns, or about 1.5 microns.

Device 420 may include additional elements, such as one or more circuits 440 for receiving photocurrent from photosensitive device 430. Circuits 440 may be integrated on a single substrate with photosensitive device 430, or may be separate. Circuits 440 may also process data based on the photocurrent. For example, one circuit 440 may convert an analog photocurrent signal to a digital signal, which another circuit 440 may process the digital signal. Other circuits 440 that may be used include amplifier circuits to amplify the photocurrent signal, and filter circuits to filter one or more aspects of the photocurrent signal. If a plurality of circuits 440 are provided, they may be integrated on a single substrate or at least some may be separate.

Computer system 400 may include other elements, such as a bus 450, a display system 455 and a display 460, a processing system 465, a main memory 470, and a storage system 475 which may include a hard disk 480, a removable disk drive 485, and a storage interface 490.

Figure 5:
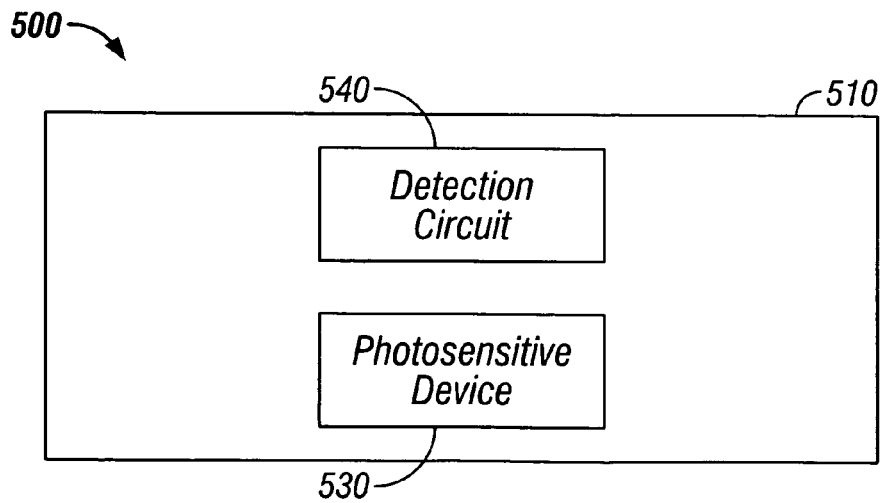
FIG. 5 shows an integrated circuit including a photosensitive device such as that shown in FIGS. 2A–2C.

Referring to FIG. 5, an integrated circuit 500 may be formed on a substrate 510. Integrated circuit 500 may include a photosensitive device 530 and a detection circuit 540. Photosensitive device 530 is generally planar and includes recessed electrodes with an active region disposed between the electrodes. Detection circuit 540 may be configured to receive an electrical signal based on the absorption of one or more photons in the active region of device 530. Additional elements may be included in integrated circuit 500, such as a circuit to convert an analog photocurrent signal to a digital signal and/or a circuit to process the photocurrent signal.

A number of embodiments have been described. Nevertheless, it will be understood that various modifications may be made without departing from the spirit and scope of the invention. For example, a number of different materials may be used for the active regions, electrodes, and substrates. Different manufacturing processes may be used to fabricate photosensitive devices. Further, the photosensitive device may detect light that is outside of the visible portion of the electromagnetic spectrum, such as infrared light. Accordingly, other embodiments are within the scope of the following claims.

The invention claimed is:

1. A system comprising:
an optical signal input; and
a generally planar photodetector including first and second electrodes, the first and second electrodes each having a top surface, the photodetector further comprising a photoactive region including a material configured to generate one or more charge carriers in response to interacting with one or more received photons, the photoactive region disposed at least partially between the first and second electrodes, the photoactive region having a top surface in optical communication with the optical signal input and substantially co-planar with the top surfaces of the first and second electrodes.

2. The system of claim 1, wherein the first and second electrodes are interdigitated with one another.

3. The system of claim 1, further comprising a circuit in communication with the first and second electrodes, the circuit configured to receive an electrical signal from at least one of the first and second electrodes, the electrical signal indicative of receiving one or more charge carriers generated in the photoactive region.

4. The system of claim 3, further comprising a processing circuit to process data indicative of the electrical signal.

5. The system of claim 1, wherein the first electrode and the second electrode are configured to produce a generally homogeneous electric field within the photoactive region in response to an applied potential difference between the first electrode and the second electrode.

6. The system of claim 1, wherein the material is configured to generate one or more charge carriers in response to interacting with one or more received photons having a wavelength in a particular wavelength range.

7. The system of claim 6, wherein the particular wavelength range includes at least one of 850 nanometers, 1.3 microns, and 1.5 microns.

8. The system of claim 1, further comprising a substrate and a layer, and wherein the layer is between the substrate and the photoactive region.

9. The system of claim 8, wherein the layer comprises a barrier layer configured to reduce transmission of charge carriers from the substrate to either or both of the first electrode and the second electrode.

10. The system of claim 1, wherein the material comprises at least one of germanium and gallium arsenide.

11. The system of claim 1, wherein a thickness of the photoactive region is at least equal to an absorption length of photons having a wavelength between about 850 nanometers and about 1.5 microns.

12. The system of claim 1, wherein a thickness of the photoactive region is about equal to a thickness of the first electrode and a thickness of the second electrode.

13. The system of claim 1, wherein an inter-electrode gap between the first electrode and the second electrode is between about 0.2 microns and about 3 microns.

14. A system comprising:
an optical signal input;
a photodetector, the photodetector comprising a region of photosensitive material having a first side, a second side, and a top surface in optical communication with the optical signal input, the photodetector further comprising a first electrode adjacent the first side of the region of photosensitive material and a second electrode adjacent the second side of the region of photosensitive material; and
wherein the first electrode and the second electrode are positioned to generate a generally homogeneous electric field in photosensitive material between the first electrode and the second electrode, in response to an applied voltage between the first electrode and the second electrode.

15. The system of claim 14, wherein the optical input is configured to receive light having a wavelength in a wavelength range, and wherein the region of the photosensitive material extends from the top surface of the photosensitive material downward for a thickness equal to or greater than an absorption length of the wavelength.

16. The system of claim 14, wherein the first and second electrodes are interdigitated with each other.

17. The system of claim 14, further comprising a circuit in communication with the first and second electrodes, the circuit configured to receive an electrical signal from at least one of the first and second electrodes indicative of the interaction of one or more photons with the photosensitive material.

18. The system of claim 17, further comprising a processing circuit, the processing circuit to process data indicative of the electrical signal.

19. The system of claim 14, wherein the photosensitive material is configured to generate one or more charge carriers in response to interacting with electromagnetic radiation in a particular wavelength range.

20. The system of claim 19, wherein the particular wavelength range includes at least one of 850 nanometers, 1.3 microns, and 1.5 microns.

21. The system of claim 14, further comprising a substrate and a layer, and wherein the layer is positioned between the substrate and a bottom surface of the photosensitive material.

22. The system of claim 21, wherein the layer comprises a barrier layer configured to reduce transmission of charge carriers from the substrate to either of the first electrode and the second electrode.

23. The system of claim 14, wherein the photosensitive material comprises at least one of germanium and gallium arsenide.

24. The system of claim 14, wherein the region of photosensitive material has a thickness at least equal to an absorption length of electromagnetic radiation of a wavelength of interest.

25. The system of claim 14, wherein the region of photosensitive material has a thickness about equal to at least one of a thickness of the first electrode and a thickness of the second electrode.

26. The system of claim 14, wherein there is an inter-electrode gap between the first electrode and the second electrode, and wherein said inter-electrode gap is between about 0.2 microns and about 3 microns.

* * * * *